United States Patent
Huang et al.

(10) Patent No.: US 8,436,645 B2
(45) Date of Patent: May 7, 2013

(54) INFORMATION GENERATING APPARATUS AND OPERATION METHOD THEREOF

(75) Inventors: Chi-Ting Huang, Tainan (TW); Chia-Chinq Chu, Tainan (TW)

(73) Assignee: Himax Technologies Limited, Tainan (TW)

(*) Notice: Subject to any disclaimer, the term of this patent is extended or adjusted under 35 U.S.C. 154(b) by 0 days.

(21) Appl. No.: 13/152,599

(22) Filed: Jun. 3, 2011

(65) Prior Publication Data
US 2012/0306560 A1    Dec. 6, 2012

(51) Int. Cl.
*H03K 19/173* (2006.01)

(52) U.S. Cl.
USPC ............ 326/38; 326/47; 326/8; 326/101

(58) Field of Classification Search ........... 326/37–41, 326/47, 113; 257/203–211
See application file for complete search history.

(56) References Cited

U.S. PATENT DOCUMENTS

| | | | | |
|---|---|---|---|---|
| 5,408,428 A * | 4/1995 | Burgess et al. | ................ | 365/94 |
| 5,723,876 A * | 3/1998 | Ray | ................ | 257/48 |
| 6,661,252 B2 * | 12/2003 | Nagano et al. | ................ | 326/37 |
| 7,120,884 B2 * | 10/2006 | Reinschmidt et al. | ........ | 257/758 |
| 7,456,652 B2 * | 11/2008 | Tu | ................ | 326/38 |
| 7,649,399 B2 * | 1/2010 | Tsai et al. | ................ | 327/365 |
| 7,768,037 B2 * | 8/2010 | Catalasan et al. | ........... | 257/211 |
| 8,209,654 B2 * | 6/2012 | Kellgren et al. | ............ | 716/136 |
| 2006/0220013 A1 * | 10/2006 | Bachman et al. | ............. | 257/48 |
| 2008/0054985 A1 * | 3/2008 | Tsai et al. | ................ | 327/427 |
| 2011/0278743 A1 * | 11/2011 | Chiu | ................ | 257/786 |

* cited by examiner

*Primary Examiner* — Jany Tran
(74) *Attorney, Agent, or Firm* — J.C. Patents

(57) ABSTRACT

An information generating apparatus and an operation method thereof are provided. The information generating apparatus includes a first logic contact, a second logic contact, an information output contact and a plurality of switches $SW_{(i,j)}$, wherein $SW_{(i,j)}$ represents a $j^{th}$ switch in an $i^{th}$ layer, $1 \leq i \leq L$, and $1 \leq j \leq 2^{(i-1)}$. The switch $SW_{(i,j)}$ has a first input terminal, a second input terminal and an output terminal, wherein the output terminal is selectively connected to the first or the second input terminal. The first and the second input terminals of the switches $SW_{(L,j)}$ in the $L^{th}$ layer are respectively connected to the first logic contact and the second logic contact. The first and the second input terminals of the switch $SW_{(i,j)}$ in other layers are respectively connected to the output terminals of the switches $SW_{(i+1,2j-1)}$ and $SW_{(i+1,2j)}$. The output terminal of the switch $SW_{(1,1)}$ is connected to the information output contact.

10 Claims, 10 Drawing Sheets

INFORMATION GENERATING APPARATUS AND OPERATION METHOD THEREOF

BACKGROUND OF THE INVENTION

1. Field of the Invention

The invention generally relates to an integrated circuit (IC), and more particularly, to an information generating apparatus and an operation method thereof.

2. Description of Related Art

The layout and function inside an integrated circuit (IC) need to be modified along with the change of design requirement. Different modifications result in ICs of different versions. An IC should be able to provide related information to the system in order to allow the system to manage/determine the version of the IC. For example, a version information generating apparatus is disposed in a timing controller (TCON, used in a display) for generating corresponding version information. The system can read the version information of the TCON through an inter-integrated circuit ($I^2C$) bus.

However, in a real application adopting the conventional technique, besides modifying the corresponding mask in the TCON according to the design requirement, the mask corresponding to the version information generating apparatus should also be modified, which increases the cost.

SUMMARY OF THE INVENTION

Accordingly, the invention is directed to an information generating apparatus and an operation method thereof, wherein when any metal layer mask of an integrated circuit (IC) is modified, logic information output by the information generating apparatus can be correspondingly modified without modifying any additional mask.

According to an embodiment of the invention, an information generating apparatus including a first logic contact, a second logic contact, an information output contact and a plurality of switches $SW_{(i,j)}$ is provided, wherein $SW_{(i,j)}$ represents a $j^{th}$ switch in an $i^{th}$ layer, $1 \leq i \leq L$, $1 \leq j \leq 2^{(i-1)}$, and L is an integer. The switch $SW_{(i,j)}$ has a first input terminal, a second input terminal and an output terminal. The output terminal of the switch $SW_{(i,j)}$ is selectively connected to the first input terminal or second input terminal of the switch $SW_{(i,j)}$. The first input terminals and the second input terminals of the switches $SW_{(L,j)}$ in the $L^{th}$ layer are respectively connected to the first logic contact and the second logic contact. The first input terminal and the second input terminal of the switch $SW_{(i,j)}$ in other layers are respectively connected to the output terminals of the switches $SW_{(i+1,2j-1)}$ and $SW_{(i+1,2j)}$. The output terminal of the switch $SW_{(1,1)}$ in the $1^{st}$ layer is connected to the information output contact.

According to an embodiment of the invention, an operation method of an information generating apparatus is provided, wherein the information generating apparatus is described above. The switches are disposed in different metal layers of an IC. A metal layer mask of the IC is modified according to a design requirement, wherein the metal layer mask is corresponding to the switches $SW_{(i,j)}$ in the $i^{th}$ layer. According to a design requirement, the output terminal and the first input terminal of an odd switch of the switches $SW_{(i,j)}$ in the $i^{th}$ layer are connected with each other, and the output terminal and the second input terminal of an even switch of the switches $SW_{(i,j)}$ in the $i^{th}$ layer are connected with each other. Or, according to a design requirement, the output terminal and the second input terminal of the odd switch of the switches $SW_{(i,j)}$ in the $i^{th}$ layer are connected with each other, and the output terminal and the first input terminal of the even switch of the switches $SW_{(i,j)}$ in the $i^{th}$ layer are connected with each other.

According to an embodiment of the invention, an operation method of an information generating apparatus is provided, wherein the information generating apparatus is described above. The switches are disposed in different metal layers of an IC. A metal layer mask of the IC is modified according to a design requirement, wherein the metal layer mask is corresponding to the switches $SW_{(i,j)}$ in the $i^{th}$ layer. According to a design requirement, the output terminals of the switches $SW_{(i,j)}$ in the $i^{th}$ layer are connected to the first input terminals of the switches $SW_{(i,j)}$ in the $i^{th}$ layer, respectively. Or, according to a design requirement, the output terminals of the switch $SW_{(i,j)}$ in the $i^{th}$ layer are connected to the second input terminals of the switch $SW_{(i,j)}$ in the $i^{th}$ layer, respectively.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
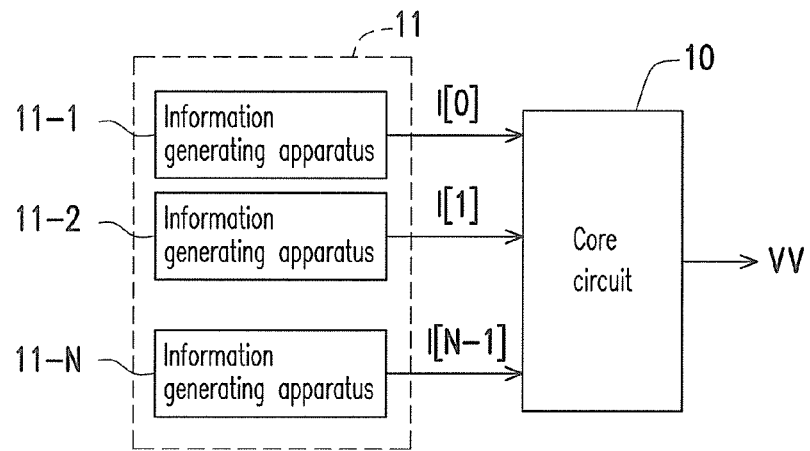
FIG. 1 is a functional block diagram of an integrated circuit (IC) according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a functional block diagram of an integrated circuit (IC) according to an embodiment of the invention. The IC includes a core circuit 10 and a chip information module 11. The chip information module 11 generates an N-bit logic information I[0:N−1] according to its configuration, wherein N is an integer. The logic information I[0:N−1] can be served as an operation parameter, a customized setting value, a version information, or any other parameter of the core circuit 10. For example, if the logic information I[0:N−1] is served as the version information of the core circuit 10, the logic information I[0:N−1] may be a version number of the core circuit 10. The configuration of the chip information module 11 has to be modified according to the modification of the core circuit 10 so as to generate the corresponding logic information I[0:N−1] for the core circuit 10. When an external system issues a "version inquiry" request to the core circuit 10, the core circuit 10 outputs its version number VV to the external system according to the logic information I[0:N−1]. Thus, the external system can determine the version of the core circuit 10 according to the logic information I[0:N−1].

Referring to FIG. 1, the chip information module 11 includes N information generating apparatuses 11-1, 11-2, ..., and 11-N. Each of the information generating apparatuses provides one bit of the logic information I[0:N−1]. For example, the first information generating apparatus 11-1 provides the bit I[0] of the logic information, the second information generating apparatus 11-2 provides the bit I[1] of the logic information, and the $N^{th}$ information generating apparatus 11-N provides the bit I[N−1] of the logic information.

During the modification process of the core circuit 10, one or more metal layer masks of the IC are usually modified. Regardless of which metal layer mask is modified, in the present embodiment, a chip designer is allowed to modify the configurations of the information generating apparatuses 11-1, 11-2, ..., and 11-N without modifying any additional mask. For example, if the chip designer needs to modify the layout of a first metal layer M1 during the modification process of the core circuit 10, the chip designer can adjust the logic information I[0:N−1] by modifying the configurations of the information generating apparatuses 11-1, 11-2, ..., and 11-N in the first metal layer M1. Namely, the chip designer can modify the logic information I[0:N−1] without modifying the mask of any metal layer other than the first metal layer M1.

Figure 2:
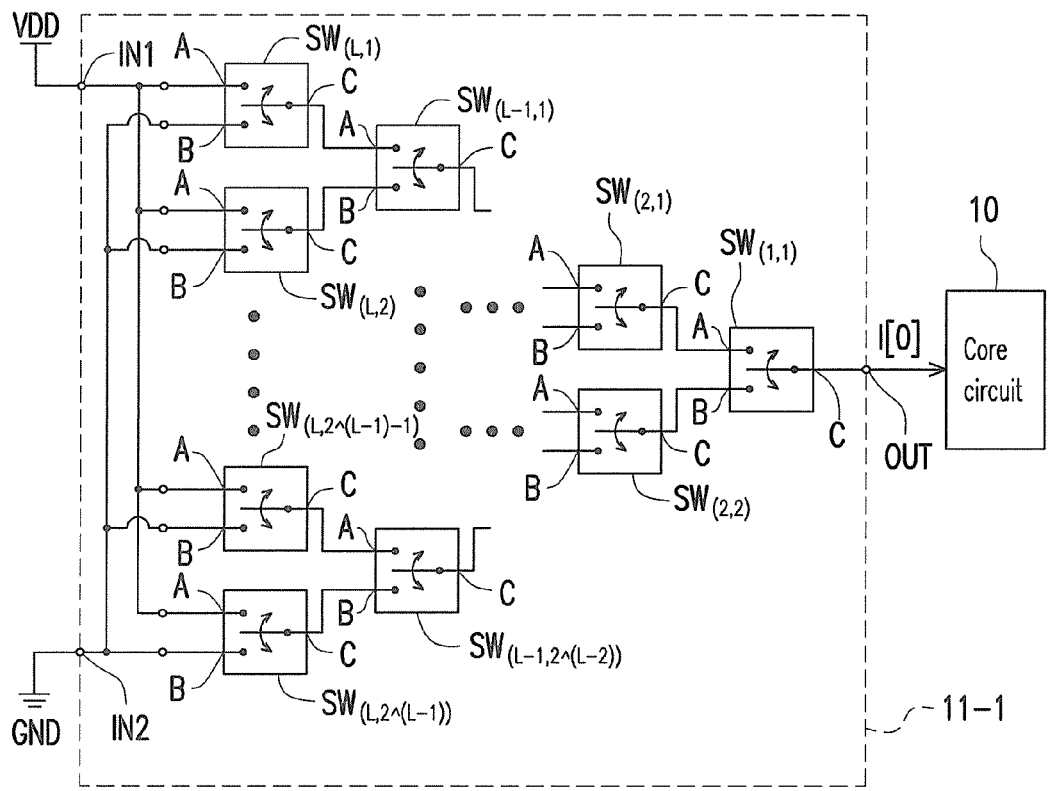
FIG. 2 is a functional block diagram of an information generating apparatus 11-1 in FIG. 1 according to an embodiment of the invention.

Below, an implementation example of the information generating apparatus 11-1 will be described, and the implementations of other information generating apparatuses 11-2, ..., and 11-N illustrated in FIG. 1 can be referred to the description related to the information generating apparatus 11-1. FIG. 2 is a functional block diagram of the information generating apparatus 11-1 in FIG. 1 according to an embodiment of the invention. In the present embodiment, it is assumed that the IC has at least L metal layers, wherein L is an integer. The information generating apparatus 11-1 includes a first logic contact IN1, a second logic contact IN2, an information output contact OUT, and a plurality of switches $SW_{(i,j)}$, wherein $SW_{(i,j)}$ represents the $j^{th}$ switch in the $i^{th}$ layer, $1 \leq i \leq L$, and $1 \leq j \leq 2^{(i-1)}$. All the switches belonging to the same layer (for example, the switches $SW_{(i,j)}$ in the $i^{th}$ layer) are disposed in the same metal layer (any metal layer) in the IC. For example, the switch $SW_{(1,1)}$ in the $1^{st}$ layer may be disposed in a first metal layer M1, a second metal layer M2, or any other metal layer in the IC. The switches belonging to different layers (for example, the switches $SW_{(i,j)}$ in the $i^{th}$ layer and the switches $SW_{(i+1,j)}$ in the $(i+1)^{th}$ layer) are disposed in different metal layers of the IC. For example, the switches $SW_{(i,j)}$ in the $i^{th}$ layer are disposed in the $(L-i+1)^{th}$ metal layer.

In the present embodiment, the first logic contact IN1 is connected to a first logic value source (for example, a system voltage source VDD), and the second logic contact IN2 is connected to a second logic value source (for example, a ground voltage source GND). In other embodiments, the first logic contact IN1 may also be connected to the ground voltage source GND, while the second logic contact IN2 may also be connected to the system voltage source VDD.

Each switch $SW_{(i,j)}$ (for example, the switch $SW_{(1,1)}$) has a first input terminal A, a second input terminal B, and an output terminal C. The output terminal C of the switch $SW_{(i,j)}$ is selectively connected to the first input terminal A or the second input terminal B of the switch $SW_{(i,j)}$.

The first input terminals A and the second input terminals B of the switches $SW_{(L,j)}$ in the $L^{th}$ layer (i.e., the switches $SW_{(L,1)}$, $SW_{(L,2)}$, ..., $SW_{(L,2^{(L-1)}-1)}$, and $SW_{(L,2^{(L-1)})}$) are respectively connected to the first logic contact IN1 and the second logic contact IN2. The first input terminals A and the second input terminals B of the switches $SW_{(i,j)}$ in other layers are respectively connected to the output terminals C of the switches $SW_{(i+1,2j-1)}$ and the switches $SW_{(i+1,2j)}$. For example, the first input terminal A and the second input terminal B of the switch $SW_{(L-1,1)}$ are respectively connected to the output terminal C of the switch $SW_{(L,1)}$ and the output terminal C of the switch $SW_{(L,2)}$. The first input terminal A and the second input terminal B of the switch $SW_{(L-1,2^{(L-2)})}$ are respectively connected to the output terminal C of the switch $SW_{(L,2^{(L-1)}-1)}$ and the output terminal C of the switch $SW_{(L,2^{(L-1)})}$. The first input terminal A and the second input terminal B of the switch $SW_{(1,1)}$ are respectively connected to the output terminal C of the switch $SW_{(2,1)}$ and the output terminal C of the switch $SW_{(2,2)}$. The output terminal C of the switch $SW_{(1,1)}$ in the $1^{st}$ layer is connected to the information output contact OUT. The information output contact OUT outputs a logic information I[0] to the core circuit 10.

Figure 3A:
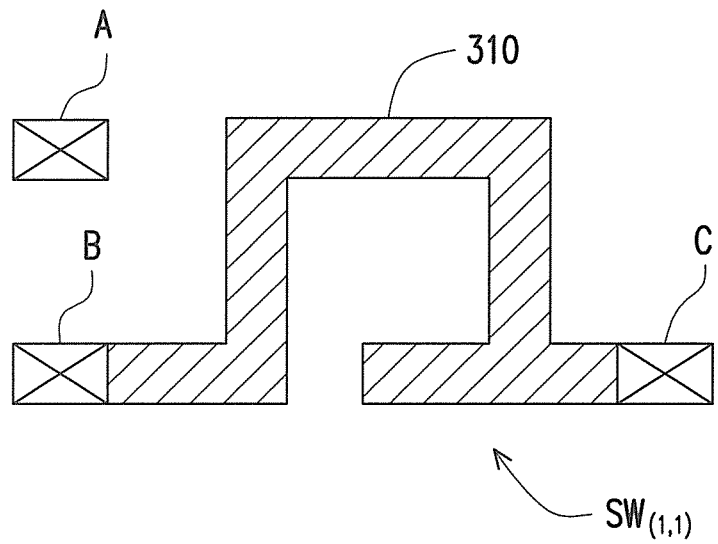
FIG. 3A and FIG. 3B are diagrams illustrating the layout of a switch in FIG. 2 according to an embodiment of the invention.
Figure 3B:
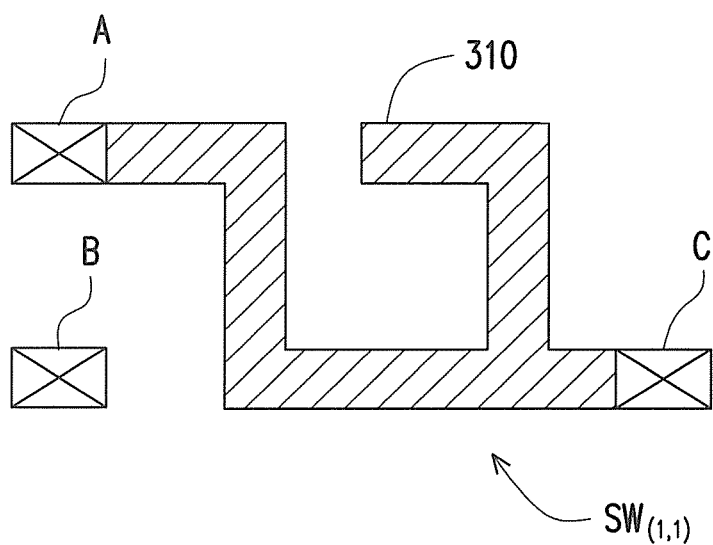

Aforementioned switches $SW_{(i,j)}$ may be switches or multiplexers. FIG. 3A and FIG. 3B are diagrams illustrating the layout of the $SW_{(1,1)}$ in FIG. 2 according to an embodiment of the invention. The implementations of other switches $SW_{(i,j)}$ in FIG. 2 can be referred to the description related to the switch $SW_{(1,1)}$. The switch $SW_{(1,1)}$ in FIG. 3A and FIG. 3B may be disposed in any metal layer (for example, the $L^{th}$ metal layer) of the IC. The switch $SW_{(1,1)}$ includes a first connecting terminal, a second connecting terminal, a third connecting terminal, and a conductive line 310. In the present embodiment, the first connecting terminal, the second connecting terminal, the third connecting terminal, and the conductive line 310 are all disposed in the $L^{th}$ metal layer of the IC. The first connecting terminal, the second connecting terminal, and the third connecting terminal are respectively served as the first input terminal A, the second input terminal B, and the output terminal C of the switch $SW_{(1,1)}$. FIG. 3A illustrates a layout in which the conductive line 310 is connected between the second input terminal B and the output terminal C. FIG. 3B illustrates a layout in which the conductive line 310 is connected between the first input terminal A and the output terminal C.

Figure 4A:
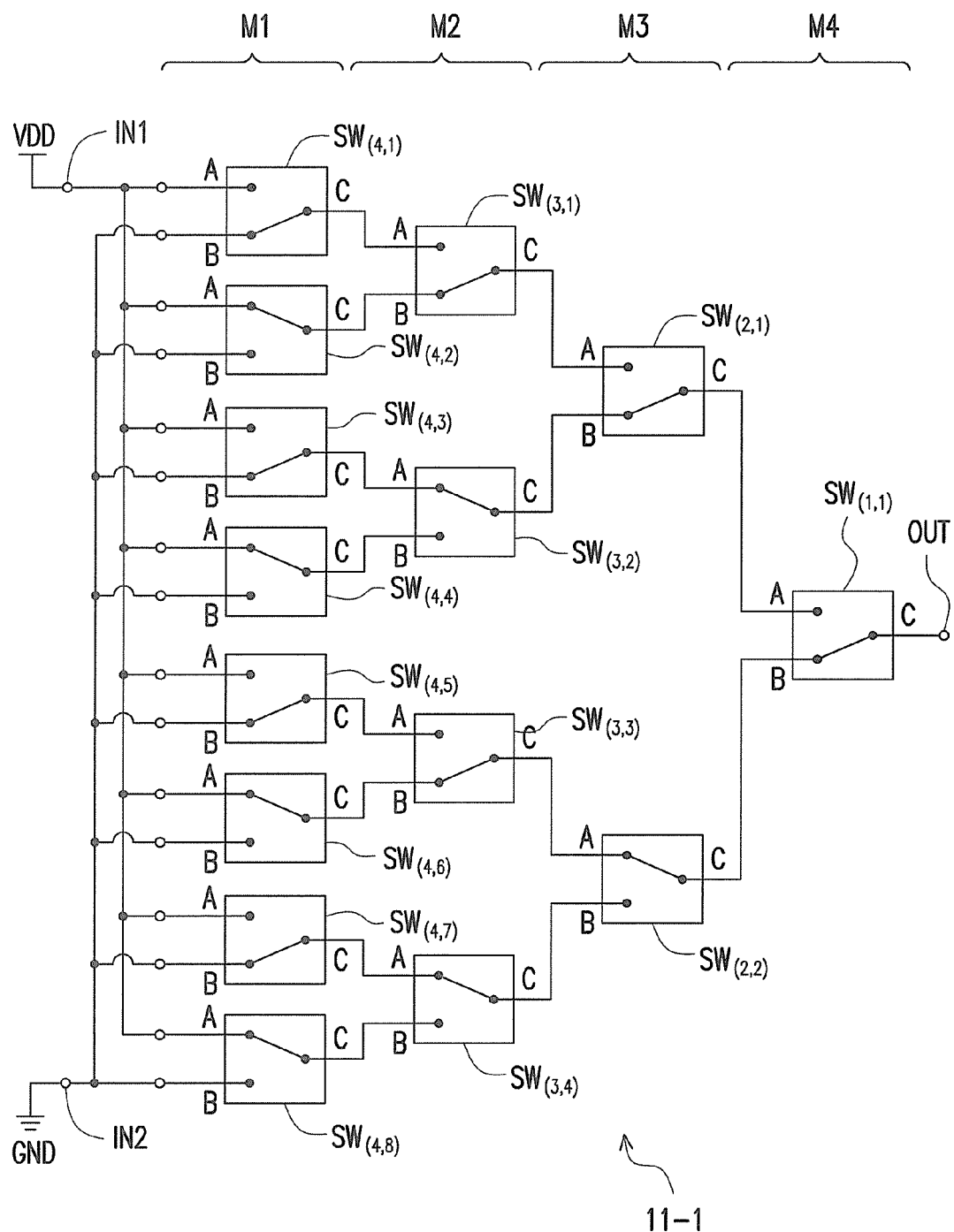
FIG. 4A is a functional block diagram of the infatuation generating apparatus 11-1 in FIG. 2 according to an embodiment of the invention.

An implementation example of the information generating apparatus 11-1 in FIG. 2 will be described by assuming the number of layers is 4 (i.e., L=4). FIG. 4A is a functional block diagram of the information generating apparatus 11-1 in FIG. 2 according to an embodiment of the invention. The switch $SW_{(1,1)}$ in the $1^{st}$ layer is disposed in a $4^{th}$ metal layer M4 of the IC. The switches $SW_{(2,1)}$ and $SW_{(2,2)}$ in the $2^{nd}$ layer are disposed in a $3^{rd}$ metal layer M3 of the IC. The switches $SW_{(3,1)}$, $SW_{(3,2)}$, $SW_{(3,3)}$, and $SW_{(3,4)}$ in the $3^{rd}$ layer are disposed in a $2^{nd}$ metal layer M2 of the IC. The switches $SW_{(4,1)}$, $SW_{(4,2)}$, $SW_{(4,3)}$, $SW_{(4,4)}$, $SW_{(4,5)}$, $SW_{(4,6)}$, $SW_{(4,7)}$, and $SW_{(4,8)}$ in the $4^{th}$ layer are disposed on the $1^{st}$ metal layer M1 of the IC.

According to the design requirement of a chip designer, the output terminals C and the first input terminals A of the odd switches in the $i^{th}$ layer are connected with each other, and the output terminals C and the second input terminals B of the even switches in the $i^{th}$ layer are connected with each other.

Or, according to the design requirement of the chip designer, the output terminals C and the second input terminals B of the odd switches in the $i^{th}$ layer are connected with each other, and the output terminals C and the first input terminals A of the even switches in the $i^{th}$ layer are connected with each other.

Referring to FIG. 4A, the output terminals C and the second input terminals B of the odd switches $SW_{(4,1)}$, $SW_{(4,3)}$, $SW_{(4,5)}$, and $SW_{(4,7)}$ in the $4^{th}$ layer are connected with each other, and the output terminals C and the first input terminals A of the even switches $SW_{(4,2)}$, $SW_{(4,4)}$, $SW_{(4,6)}$, and $SW_{(4,8)}$ in the $4^{th}$ layer are connected with each other. The output terminals C and the second input terminals B of the odd switches $SW_{(3,1)}$ and $SW_{(3,3)}$ in the $3^{rd}$ layer are connected with each other, and the output terminals C and the first input terminals A of the even switches $SW_{(3,2)}$ and $SW_{(3,4)}$ in the $3^{rd}$ layer are connected with each other. The output terminal C and the second input terminal B of the odd switch $SW_{(2,1)}$ in the $2^{nd}$ layer are connected with each other, and the output terminal C and the first input terminal A of the even switch $SW_{(2,2)}$ in the $2^{nd}$ layer are connected with each other. The output terminal C and the second input terminal B of the odd switch $SW_{(1,1)}$ in the $1^{st}$ layer are connected with each other. Herein the logic information I[0] provided by the information generating apparatus 11-1 through the information output contact OUT is a system voltage VDD (i.e., a logic value "1").

Figure 4B:
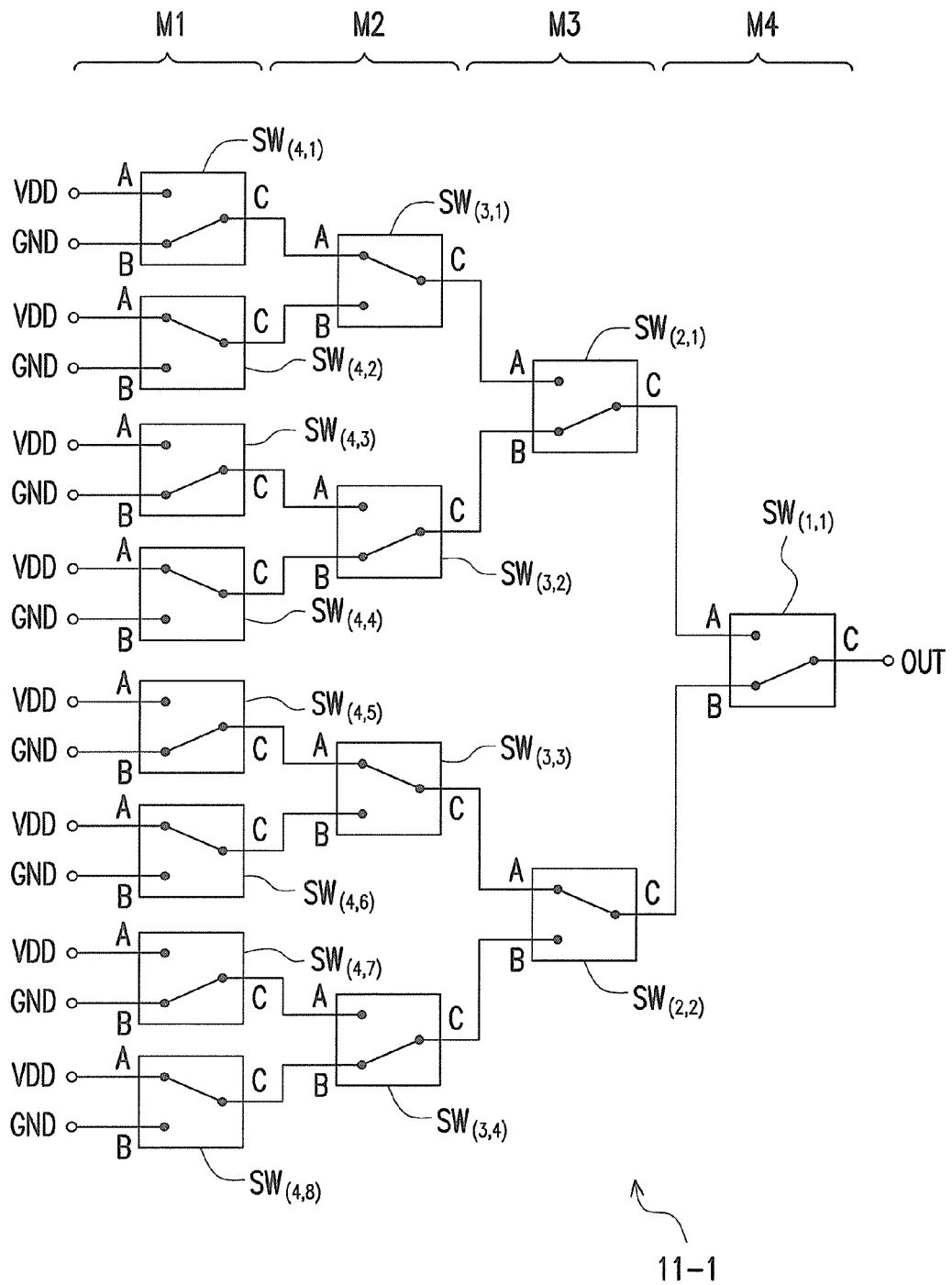
FIGS. 4B-4D are diagrams illustrating how the information generating apparatus 11-1 in FIG. 4A is modified according to design requirements according to an embodiment of the invention.
Figure 4C:
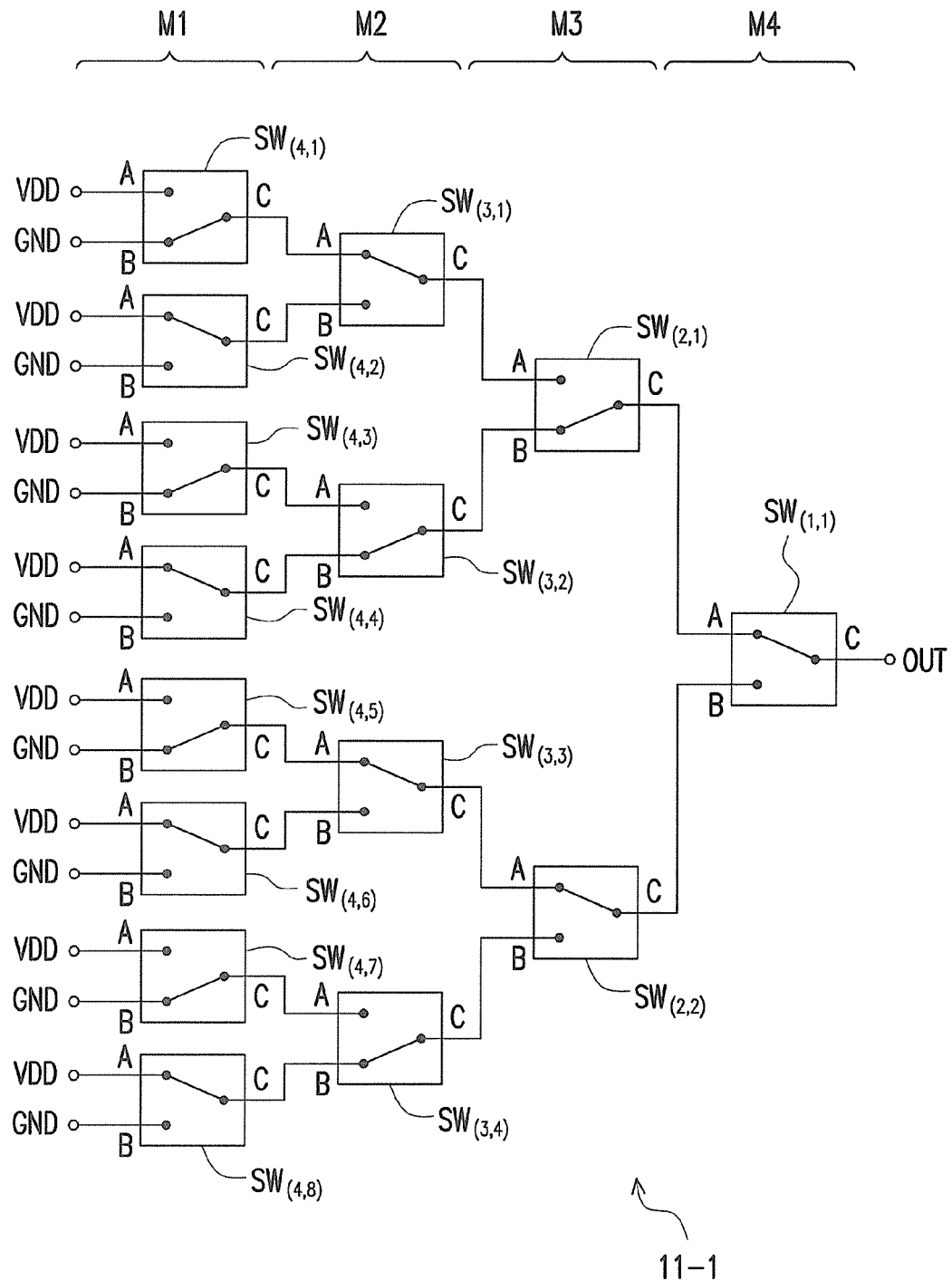
Figure 4D:
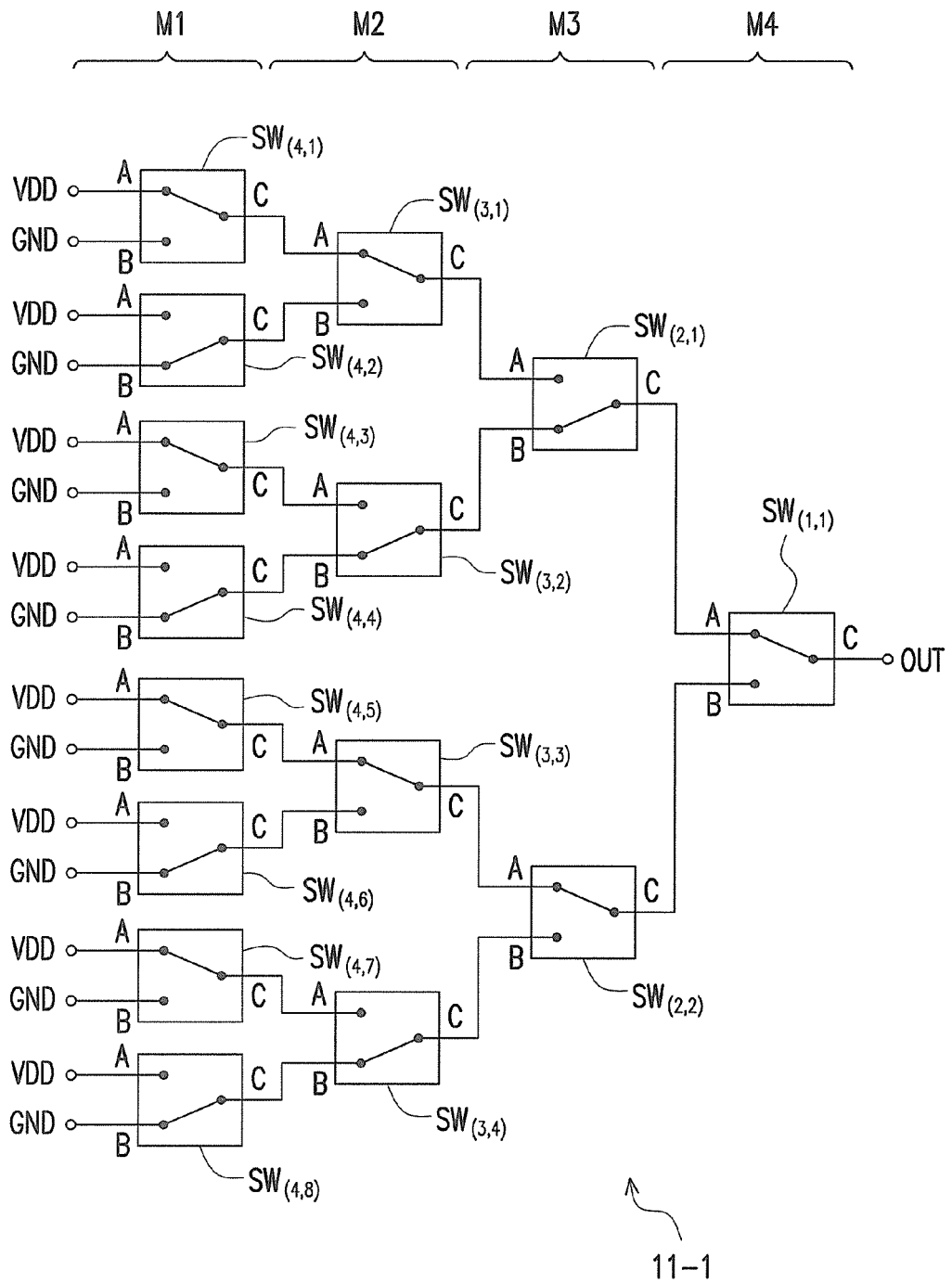

Assuming that the chip designer modifies the mask(s) of one or more metal layers of the IC according to a design requirement, regardless of which metal layer the modified mask(s) belongs to, the chip designer can always modify the corresponding switches $SW_{(i,j)}$ in the same metal layer. FIGS. 4B-4D are diagrams illustrating how the information generating apparatus 11-1 in FIG. 4A is modified according to design requirements according to an embodiment of the invention. For example, if according to a design requirement, the chip designer needs to modify the mask of the $2^{nd}$ metal layer M2 in the IC and the logic information I[0] provided by the information generating apparatus 11-1 through the information output contact OUT needs to be changed to the ground voltage GND (i.e., a logic value "0"), the chip designer can connect the output terminals C of the odd switches $SW_{(3,1)}$ and $SW_{(3,3)}$ in the $3^{rd}$ layer to the first input terminals A of the odd switches $SW_{(3,1)}$ and $SW_{(3,3)}$ in the $3^{rd}$ layer and connect the output terminals C of the even switches $SW_{(3,2)}$ and $SW_{(3,4)}$ in the $3^{rd}$ layer to the second input terminals B of the even switches $SW_{(3,2)}$ and $SW_{(3,4)}$ in the $3^{rd}$ layer according to the design requirement, as shown in FIG. 4B. Thereby, the chip designer can change the logic information I[0] output by the information generating apparatus 11-1 from the system voltage VDD to the ground voltage GND without modifying any additional metal layer mask.

Referring to FIG. 4B, if according to a design requirement, the chip designer needs to modify the mask of the $4^{th}$ metal layer M4 in the IC and the logic information I[0] provided by the information generating apparatus 11-1 through the information output contact OUT needs to be changed back to the system voltage VDD, the chip designer can connect the output terminal C of the odd switch $SW_{(1,1)}$ in the $1^{st}$ layer corresponding to the $4^{th}$ metal layer M4 to the first input terminal A of the odd switch $SW_{(1,1)}$ in the $1^{st}$ layer according to the design requirement, as shown in FIG. 4C. Thereby, the chip designer can change the logic information I[0] output by the information generating apparatus 11-1 from the ground voltage GND to the system voltage VDD without modifying any additional metal layer mask.

Referring to FIG. 4C, if according to a design requirement, the chip designer needs to modify the mask of the $1^{st}$ metal layer M1 in the IC and the logic information I[0] provided by the information generating apparatus 11-1 through the information output contact OUT needs to be changed back to the ground voltage GND, the chip designer can connect the output terminals C of the odd switches $SW_{(4,1)}$, $SW_{(4,3)}$, $SW_{(4,5)}$, and $SW_{(4,7)}$ in the $4^{th}$ layer corresponding to the $1^{st}$ metal layer M1 to the first input ten finals A of the odd switches $SW_{(4,1)}$, $SW_{(4,3)}$, $SW_{(4,5)}$, and $SW_{(4,7)}$ in the $4^{th}$ layer and connect the output terminals C of the even switches $SW_{(4,2)}$, $SW_{(4,4)}$, $SW_{(4,6)}$, and $SW_{(4,8)}$ in the $4^{th}$ layer to the second input terminals B of the even switches $SW_{(4,2)}$, $SW_{(4,4)}$, $SW_{(4,6)}$, and $SW_{(4,8)}$ in the $4^{th}$ layer according to the design requirement, as shown in FIG. 4D. Thereby, the chip designer can change the logic information I[0] output by the information generating apparatus 11-1 from the system voltage VDD to the ground voltage GND without modifying any additional metal layer mask.

Figure 5A:
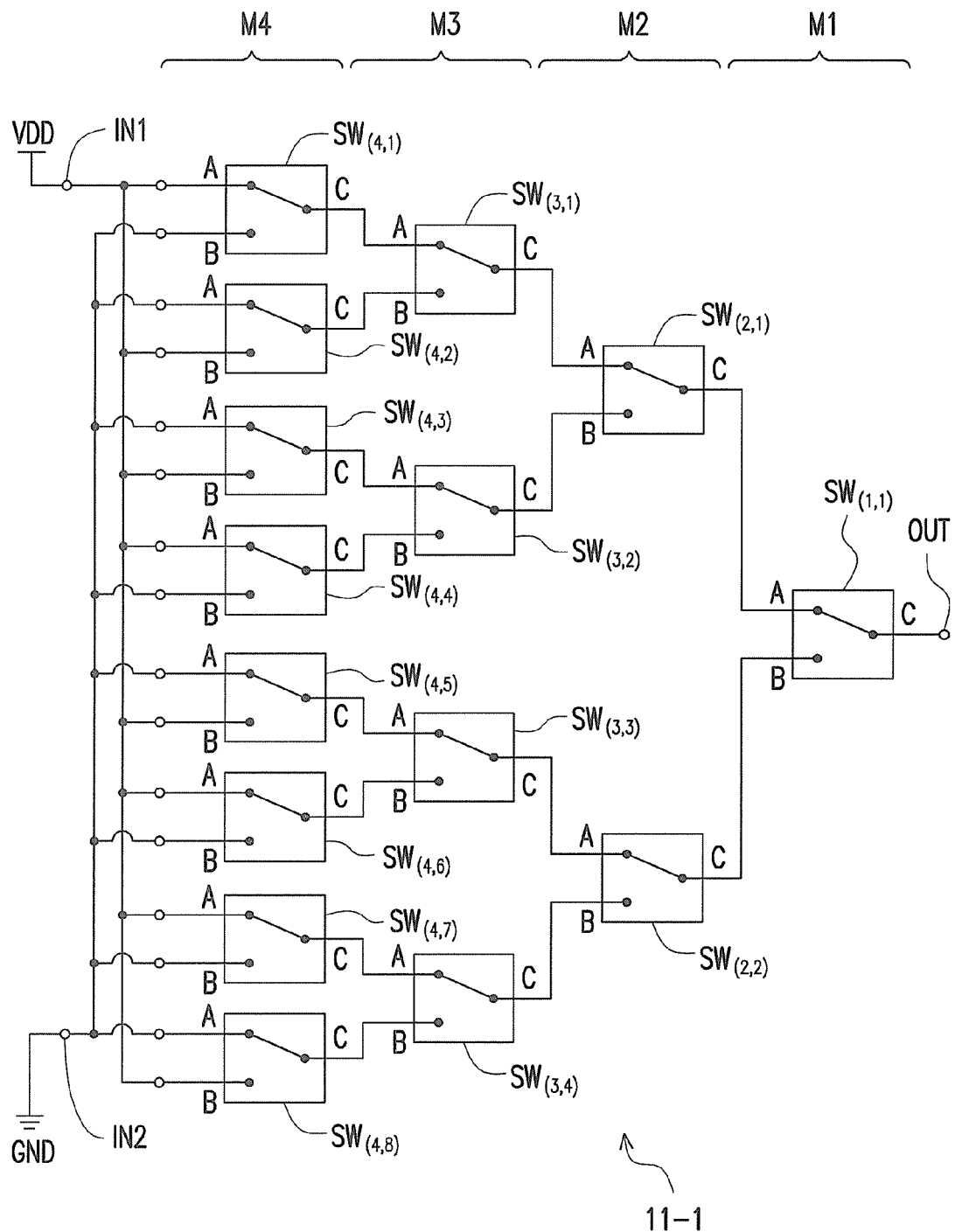
FIG. 5A is a functional block diagram of the information generating apparatus 11-1 in FIG. 2 according to another embodiment of the invention.

FIG. 5A is a functional block diagram of the information generating apparatus 11-1 in FIG. 2 according to another embodiment of the invention. In FIGS. 4A to 4D, the switches $SW_{(i,j)}$ in the $i^{th}$ layer are disposed in the $(L-i+1)^{th}$ metal layer. In FIGS. 5A to 5D, the switches $SW_{(i,j)}$ in the $i^{th}$ layer are disposed in the $i^{th}$ metal layer. The switch $SW_{(1,1)}$ in the $1^{st}$ layer is disposed in the $1^{st}$ metal layer M1 of the IC. The switches $SW_{(2,1)}$ and $SW_{(2,2)}$ in the $2^{nd}$ layer are disposed in the $2^{nd}$ metal layer M2 of the IC. The switches $SW_{(3,1)}$, $SW_{(3,2)}$, $SW_{(3,3)}$, and $SW_{(3,4)}$ in the $3^{rd}$ layer are disposed in the $3^{rd}$ metal layer M3 of the IC. The switches $SW_{(4,1)}$, $SW_{(4,2)}$, $SW_{(4,3)}$, $SW_{(4,4)}$, $SW_{(4,5)}$, $SW_{(4,6)}$, $SW_{(4,7)}$, and $SW_{(4,8)}$ in the $4^{th}$ layer are disposed in the $4^{th}$ metal layer M4 of the IC.

According to a design requirement of the chip designer, the output terminals C and the first input terminals A of the switches $SW_{(i,j)}$ in the $i^{th}$ layer are connected with each other. Or, according to a design requirement of the chip designer, the output terminals C and the second input terminals B of the switches $SW_{(i,j)}$ in the $i^{th}$ layer are connected with each other.

Referring to FIG. 5A, the output terminals C and the first input terminals A of the switches $SW_{(4,1)}$, $SW_{(4,2)}$, $SW_{(4,3)}$, $SW_{(4,4)}$, $SW_{(4,5)}$, $SW_{(4,6)}$, $SW_{(4,7)}$, and $SW_{(4,8)}$ in the $4^{th}$ layer are connected with each other. The output terminals C and the first input terminals A of the switches $SW_{(3,1)}$, $SW_{(3,2)}$, $SW_{(3,3)}$, and $SW_{(3,4)}$ in the $3^{rd}$ layer are connected with each other. The output terminals C and the first input terminals A of the switches $SW_{(2,1)}$ and $SW_{(2,2)}$ in the $2^{nd}$ layer are connected with each other. The output terminal C and the first input terminal A of the switch $SW_{(1,1)}$ in the $1^{st}$ layer are connected with each other. Herein the logic information I[0] provided by the information generating apparatus 11-1 through the information output contact OUT is the system voltage VDD (i.e., the logic value "1").

Figure 5B:
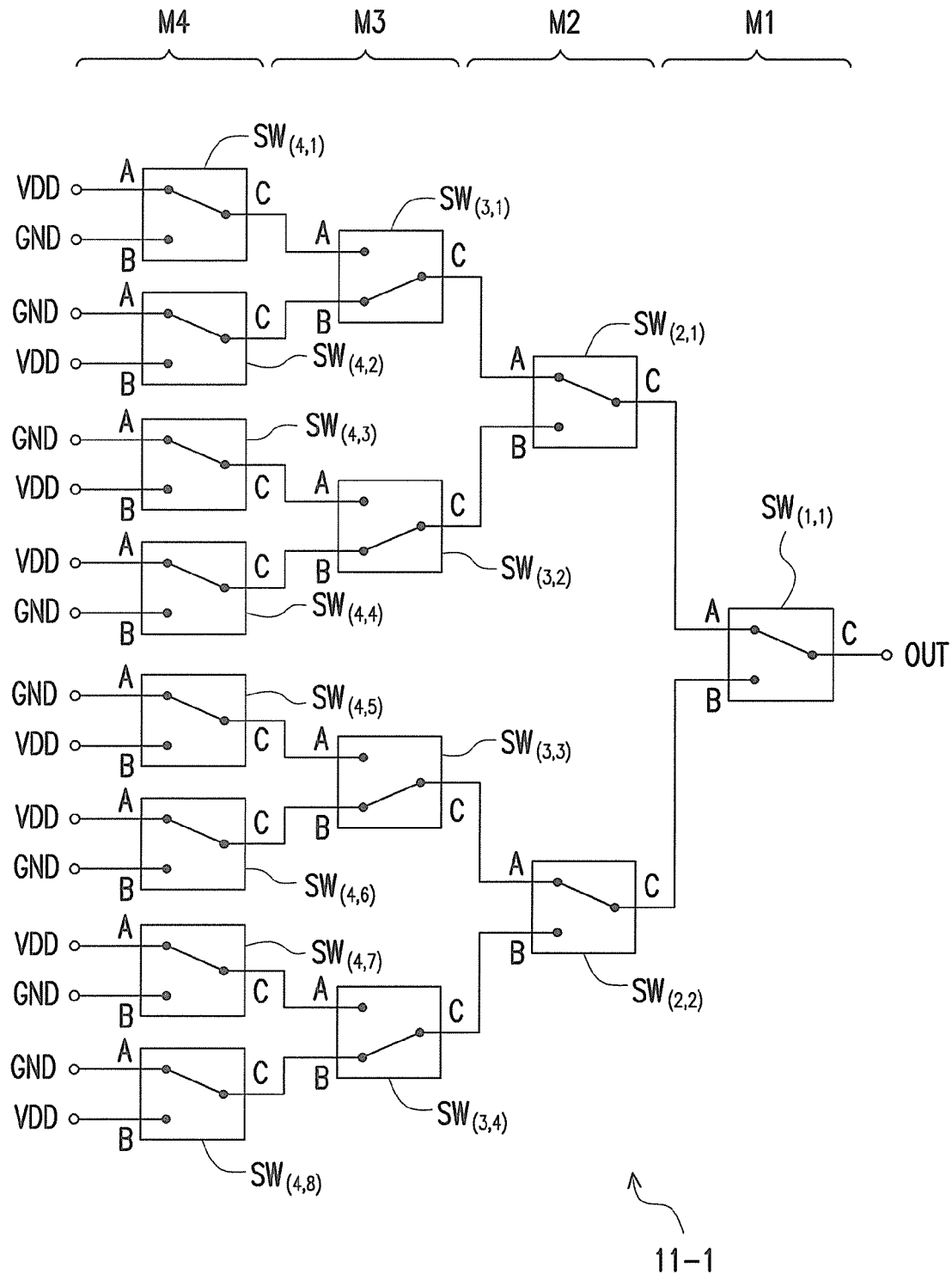
FIGS. 5B-5D are diagrams illustrating how the information generating apparatus 11-1 in FIG. 5A is modified according to design requirements according to another embodiment of the invention.
Figure 5C:
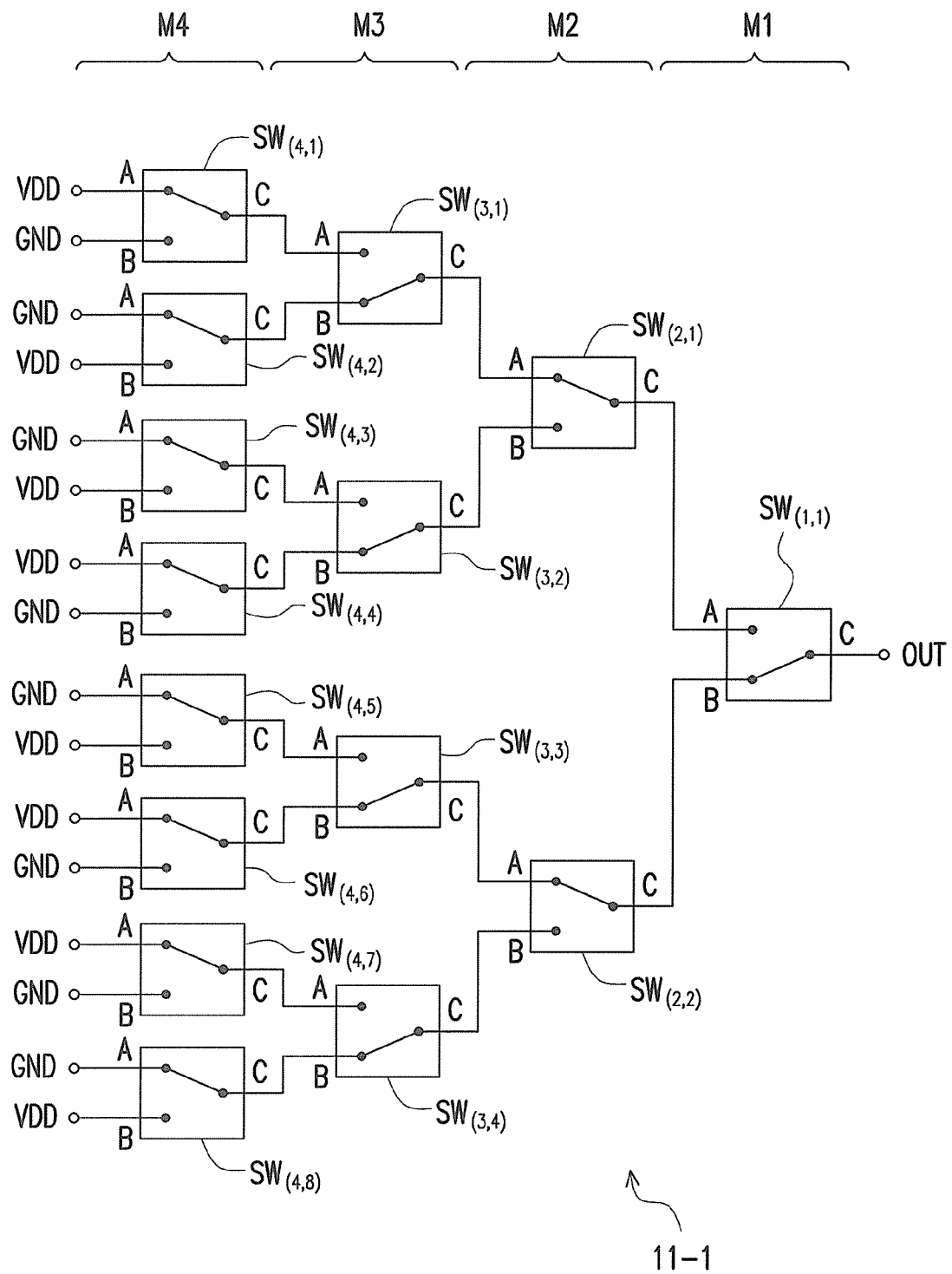
Figure 5D:
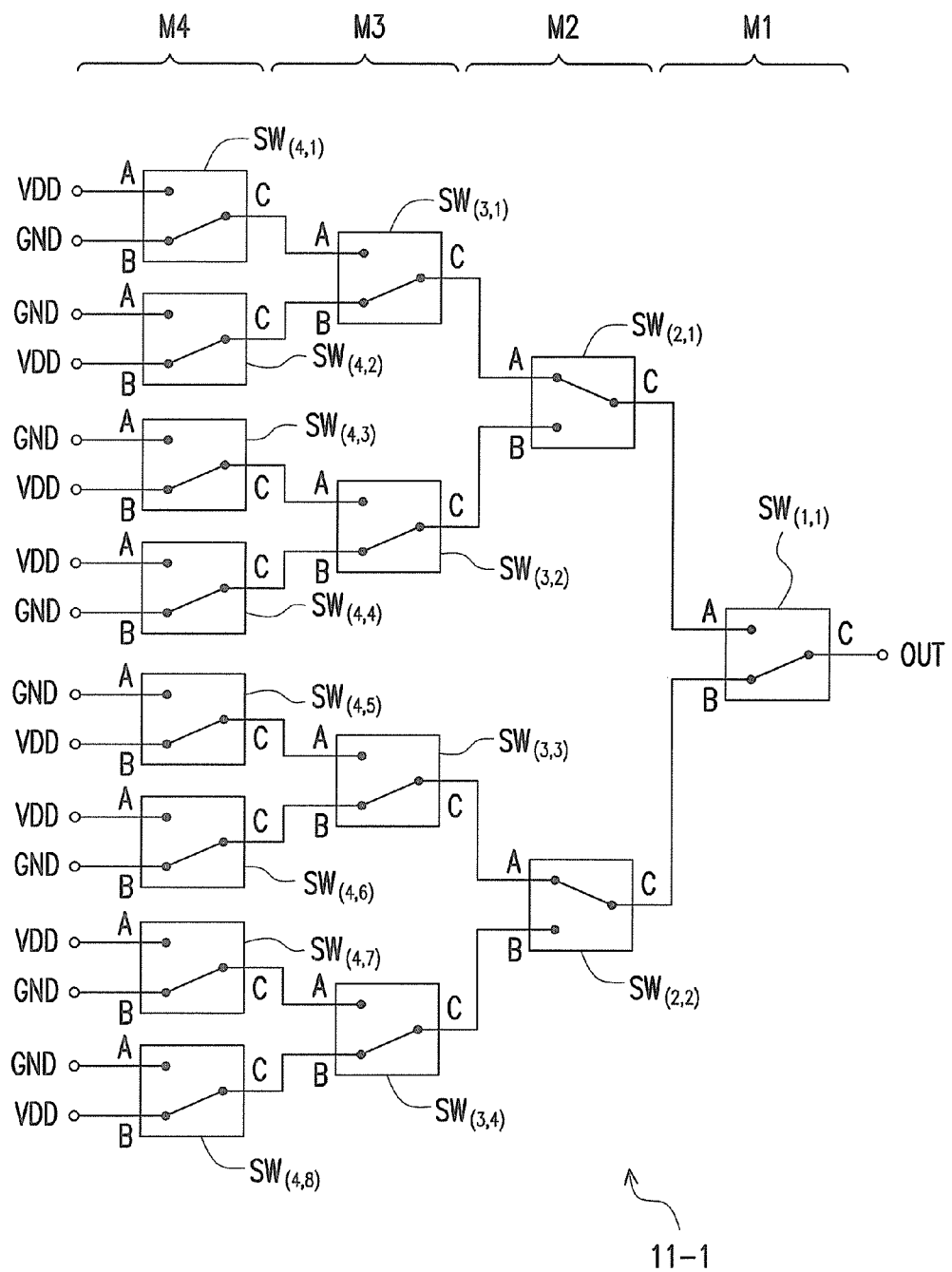

Assuming that the chip designer modifies the mask(s) of one or more metal layers of the IC according to a design requirement, regardless of which metal layer the modified mask(s) belongs to, the chip designer can always modify the corresponding switches $SW_{(i,j)}$ in the same metal layer. FIGS. 5B-5D are diagrams illustrating how the information generating apparatus 11-1 in FIG. 5A is modified according to design requirements according to another embodiment of the invention. For example, if according to a design requirement, the chip designer needs to modify the mask of the $3^{rd}$ metal layer M3 in the IC and the logic information I[0] provided by the information generating apparatus 11-1 through the information output contact OUT needs to be changed to the ground voltage GND (i.e., the logic value "0"), the chip designer can connect the output terminals C of the switches $SW_{(3,1)}$, $SW_{(3,2)}$, $SW_{(3,3)}$, and $SW_{(3,4)}$ in the $3^{rd}$ layer to the second input terminals B of the switches $SW_{(3,1)}$, $SW_{(3,2)}$, $SW_{(3,3)}$, and $SW_{(3,4)}$ in the $3^{rd}$ layer according to the design requirement, as shown in FIG. 5B. Thereby, the chip designer can change the logic information I[0] output by the information generating apparatus 11-1 from the system voltage VDD to the ground voltage GND without modifying any additional metal layer mask.

Referring to FIG. 5B, if according to a design requirement, the chip designer needs to modify the mask of the $1^{st}$ metal layer M1 in the IC and the logic information I[0] provided by the information generating apparatus 11-1 through the information output contact OUT needs to be changed back to the system voltage VDD, the chip designer can connect the output terminal C of the switch $SW_{(1,1)}$ in the $1^{st}$ layer corresponding to the $1^{st}$ metal layer M1 to the second input terminal B of the switch $SW_{(1,1)}$ in the $1^{st}$ layer according to the design requirement, as shown in FIG. 5C. Thereby, the chip designer can change the logic information I[0] output by the information generating apparatus 11-1 from the ground voltage GND to the system voltage VDD without modifying any additional metal layer mask.

Referring to FIG. 5C, if according to a design requirement, the chip designer needs to modify the mask of the $4^{th}$ metal layer M4 in the IC and the logic information I[0] provided by the information generating apparatus 11-1 through the information output contact OUT needs to be changed back to the ground voltage GND, the chip designer can connect the output terminals C of the switches $SW_{(4,1)}$, $SW_{(4,2)}$, $SW_{(4,3)}$, $SW_{(4,4)}$, $SW_{(4,5)}$, $SW_{(4,6)}$, $SW_{(4,7)}$, and $SW_{(4,8)}$ in the $4^{th}$ layer corresponding to the $4^{th}$ metal layer M4 to the second input terminals B of the switches $SW_{(4,1)}$, $SW_{(4,2)}$, $SW_{(4,3)}$, $SW_{(4,4)}$, $SW_{(4,5)}$, $SW_{(4,6)}$, $SW_{(4,7)}$, and $SW_{(4,8)}$ in the $4^{th}$ layer according to the design requirement, as shown in FIG. 5D. Thereby, the chip designer can change the logic information I[0] output by the information generating apparatus 11-1 from the system voltage VDD to the ground voltage GND without modifying any additional metal layer mask.

In summary, according to embodiments of the invention, regardless of which metal layer a modified mask belongs to, a chip designer is allowed to modify the corresponding switches $SW_{(i,j)}$ in the same metal layer, so as to adjust the logic information provided by the information generating apparatuses 11-1-11-N correspondingly.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An information generating apparatus, comprising:
a first logic contact, for connecting to a first logic value source;
a second logic contact, for connecting to a second logic value source;
an information output contact, for outputting a logic information; and
a plurality of switches $SW_{(i,j)}$, wherein $SW_{(i,j)}$ represents a $j^{th}$ switch in an $i^{th}$ layer, $1 \leq i \leq L$, $1 \leq j \leq 2^{(i-1)}$, and L is an integer equal to or greater than 2 and the number of the switches $SW_{(i,j)}$ of the $i^{th}$ layer is $2^{(i-1)}$, each of the switch $SW_{(i,j)}$ has a first input terminal, a second input terminal and one output terminal, the output terminal of the switch $SW_{(i,j)}$ is selectively connected to the first input terminal or the second input terminal of the switch $SW_{(i,j)}$, the first input terminals and the second input terminals of the switches $SW_{(L,j)}$ are respectively connected to the first logic contact and the second logic contact, the first input terminal and the second input terminal of the other switch $SW_{(i,j)}$ are respectively connected to the output terminal of the switch $SW_{(i+1,2j-1)}$ and the output terminal of the switch $SW_{(i+1,2j)}$, and the output terminal of the switch $SW_{(1,1)}$ is connected to the information output contact.

2. The information generating apparatus according to claim 1, wherein the output terminal and the first input terminal of an odd switch of the switches $SW_{(i,j)}$ in the $i^{th}$ layer are connected with each other, and the output terminal and the second input terminal of an even switch of the switches $SW_{(i,j)}$ in the $i^{th}$ layer are connected with each other; or the output terminal and the second input terminal of the odd switch of the switches $SW_{(i,j)}$ in the $i^{th}$ layer are connected with each other, and the output terminal and the first input terminal of the even switch of the switches $SW_{(i,j)}$ in the $i^{th}$ layer are connected with each other.

3. The information generating apparatus according to claim 1, wherein the output terminal and the first input terminal of the switch $SW_{(i,j)}$ in the $i^{th}$ layer are connected with each other; or the output terminal and the second input terminal of the switch $SW_{(i,j)}$ in the $i^{th}$ layer are connected with each other.

4. The information generating apparatus according to claim 1, wherein the switches $SW_{(i,j)}$ are disposed in a $(L-i+1)^{th}$ metal layer of an integrated circuit.

5. The information generating apparatus according to claim 1, wherein the switches $SW_{(i,j)}$ are disposed in a $i^{th}$ metal layer of an integrated circuit.

6. The information generating apparatus according to claim 1, wherein the switches $SW_{(i,j)}$ are switches or multiplexers.

7. The information generating apparatus according to claim 1, wherein each of the switches $SW_{(i,j)}$ comprises:
a first connecting terminal, disposed in a $(L-i+1)^{th}$ metal layer of an integrated circuit, serving as the first input terminal;
a second connecting terminal, disposed in the $(L-i+1)^{th}$ metal layer, serving as the second input terminal;
a third connecting terminal, disposed in the $(L-i+1)^{th}$ metal layer, serving as the output terminal; and
a conductive line, disposed in the $(L-i+1)^{th}$ metal layer, wherein the conductive line is disposed and connected between the first connecting terminal and the third connecting terminal or between the second connecting terminal and the third connecting terminal.

8. The information generating apparatus according to claim 1, wherein each of the switches $SW_{(i,j)}$ comprises:
a first connecting terminal, disposed in a $i^{th}$ metal layer of an integrated circuit, serving as the first input terminal;
a second connecting terminal, disposed in the $i^{th}$ metal layer, serving as the second input terminal;
a third connecting terminal, disposed in the $i^{th}$ metal layer, serving as the output terminal; and
a conductive line, disposed in the $i^{th}$ metal layer, wherein the conductive line is disposed and connected between the first connecting terminal and the third connecting terminal or between the second connecting terminal and the third connecting terminal.

9. An operation method of an information generating apparatus, wherein the information generating apparatus is described in claim 1, the operation method comprising:
disposing the switches in different metal layers of an integrated circuit;

modifying a metal layer mask of the IC, wherein the metal layer mask is corresponding to the switches $SW_{(i,j)}$ in the $i^{th}$ layer; and connecting the output terminal and the first input terminal of an odd switch of the switches $SW_{(i,j)}$ in the $i^{th}$ layer with each other, and connecting the output terminal and the second input terminal of an even switch of the switches $SW_{(i,j)}$ in the $i^{th}$ layer with each other; or connecting the output terminal and the second input terminal of the odd switch of the switches $SW_{(i,j)}$ in the $i^{th}$ layer with each other, and connecting the output terminal and the first input terminal of the even switch of the switches $SW_{(i,j)}$ in the $i^{th}$ layer with each other.

10. An operation method of an information generating apparatus, wherein the information generating apparatus is described in claim 1, the operation method comprising:

disposing the switches in different metal layers of an integrated circuit;

modifying a metal layer mask of the IC, wherein the metal layer mask is corresponding to the switches $SW_{(i,j)}$ in the $i^{th}$ layer; and connecting the output terminals of the switches $SW_{(i,j)}$ in the $i^{th}$ layer to the first input terminals of the switches $SW_{(i,j)}$ in the $i^{th}$ layer, respectively; or connecting the output terminals of the switches $SW_{(i,j)}$ in the $i^{th}$ layer to the second input terminals of the switches $SW_{(i,j)}$ in the $i^{th}$ layer, respectively.

* * * * *